United States Patent
Ulmer et al.

(10) Patent No.: US 8,043,889 B1
(45) Date of Patent: Oct. 25, 2011

(54) PATTERNED CHEMICAL BATH DEPOSITION OF A TEXTURED THIN FILM FROM A PRINTED SEED LAYER

(75) Inventors: Kurt Ulmer, Vancouver, WA (US); Garry Hinch, Salem, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 12/845,614

(22) Filed: Jul. 28, 2010

(51) Int. Cl.
  H01L 21/00 (2006.01)
  H01L 21/20 (2006.01)
  H01L 21/44 (2006.01)

(52) U.S. Cl. ......................... 438/104; 438/584; 438/608

(58) Field of Classification Search .................. None
  See application file for complete search history.

(56) References Cited

U.S. PATENT DOCUMENTS

| | | | |
|---|---|---|---|
| 7,285,501 | B2 | 10/2007 | Mardilovich et al. |
| 7,691,666 | B2 | 4/2010 | Levy et al. |
| 2007/0020400 | A1* | 1/2007 | Chang .................. 427/421.1 |
| 2009/0194160 | A1* | 8/2009 | Chin et al. .................. 136/256 |
| 2010/0276003 | A1* | 11/2010 | Kawano et al. .............. 136/261 |
| 2011/0079754 | A1* | 4/2011 | Hsieh et al. .............. 252/519.33 |

OTHER PUBLICATIONS

Yang L. L. et al., Effective Way to Control the Size of Well-Aligned ZnO Nanorod Arrays With Two-Step Chemical Bath Deposition, Journal of Crystal Growth, 311 (2009) pp. 1046-1050, available online Dec. 24, 2008.*

Kumar P. S. et al. Growth and Characterization of ZnO Nanostructured Thin Films by a Two Step Chemical Method, Applied Surface Science, 255 (2008) pp. 2382-2387, available online Aug. 3, 2008.*

Wang et al., "Chemical bath deposition of textured ZnO thin film in aqueous/ethanolic solution", Materials Letters (2008), 62(30), 4532-4534.

Wang et al. Influence of annealing temperature on the structural and optical properties of sol-gel perepared ZnO thin films', Phys. Stat. Sol. (a) 203, No. 10, 2418-2455 (200.

* cited by examiner

*Primary Examiner* — Scott B Geyer
(74) *Attorney, Agent, or Firm* — Law Offices of Gerald Maliszewski; Gerald Maliszewski

(57) ABSTRACT

A chemical bath deposition (CBD) process is provided for forming a textured zinc oxide film pattern from a zinc oxide printed seed layer. The process provides a substrate and prints a zinc oxide seed layer in a pattern overlying the substrate. Using a CBD process, a textured zinc oxide film is grown overlying the zinc oxide seed layer pattern, where the textured zinc oxide film has a variation in film thickness of greater than 200 nanometers (nm). In one aspect, growing the textured zinc oxide film includes: preparing a ZnO precursor bath; maintaining a bath temperature of about 70 degrees C.; and, leaving the substrate in the bath for about an hour. In another aspect, growing the textured zinc oxide film includes forming a textured zinc oxide film with zinc oxide crystals having a pyramidal shape with a height of greater than 200 nm.

20 Claims, 3 Drawing Sheets

US 8,043,889 B1

PATTERNED CHEMICAL BATH DEPOSITION OF A TEXTURED THIN FILM FROM A PRINTED SEED LAYER

BACKGROUND OF THE INVENTION

1. Field of the Invention

This invention generally relates to photovoltaic cell and integrated circuit (IC) fabrication and, more particularly, to a method for forming a textured thin film from a printed seed layer pattern using a chemical bath deposition process.

2. Description of the Related Art

The patterning of conductive oxides is typically accomplished by photolithographic patterning and employing a dry or wet chemical etch process to remove unwanted areas of conductive oxides. Materials need to be patterned so that useful circuits can be defined. However, photolithographic patterning requires expensive equipment and the process must pattern active materials in an additive fashion.

In contrast to photolithographic patterning techniques, it is becoming common to pattern some thin film materials more simply using a printing deposition process. A conventional inkjet device, for example, includes a solution cartridge with a plurality of chambers. If the process is thermal, each chamber may include a heater. To eject a droplet from each chamber, a pulse of current is passed through the heating element causing a rapid vaporization of the solution in the chamber to form a bubble, which causes a large pressure increase, propelling a droplet of solution onto the substrate. The solution's surface tension and condensation, in cooperation with the contraction of the vapor bubble, pulls a further charge of solution into the chamber. The solution typically includes a volatile component to form the vapor bubble, otherwise droplet ejection cannot occur.

If the process is piezoelectric, each chamber may include a piezoelectric element. To eject a droplet from each chamber, an electrical signal is sent to the piezoelectric element causing a change in strain within the piezoelectric element. This strain creates an acoustic wave within the ink in the chamber. Upon interaction with the printhead nozzle, this acoustic wave generates a droplet that is propelled onto the substrate.

It would be advantageous if conductive oxide patterns could be formed on a substrate using a simple printing process.

It would be advantageous if the above-mentioned printing could form textured conductive oxide surfaces to enhance light absorption.

SUMMARY OF THE INVENTION

Described herein is an additive process in which only the areas of interest on a substrate are printed with seed layer material, and a textured conductive oxide is grown from solution in those specific areas only. In general, additive processes are considered to be less expensive and have a lower environmental impact. The entirely solution-based processes described herein also promote lower manufacturing costs. Employing a digitally based printing method such as inkjet for deposition of the seed layer, provides an additional advantage of speed and ease of changing the product design specifications. The printing technology is also applicable to flexible and/or large area substrates that would be difficult and/or very expensive to pattern using lithography.

More explicitly, a method is introduced for producing a patterned layer of textured zinc oxide on a substrate. A printing method, for example inkjet printing, is used to apply a seed layer solution to a substrate in a predetermined pattern. Any additive printing method could be chosen for application of this seed layer without impact to the end result. A textured zinc oxide chemical bath deposition process known in the art can be employed to form a conductive layer of zinc oxide. The textured zinc oxide layer grows only in the regions of printed seed layer. In this way, a patterned transparent conductor can be directly applied to a substrate without any further processing.

Accordingly, a chemical bath deposition (CBD) process is provided for forming a textured zinc oxide film pattern from a zinc oxide printed seed layer. The process provides a substrate and prints a zinc oxide seed layer in a pattern overlying the substrate. Using a CBD process, a textured zinc oxide film is grown overlying the zinc oxide seed layer pattern, where the textured zinc oxide film has a variation in film thickness of greater than 200 nanometers.

In one aspect, growing the textured zinc oxide film includes: preparing a ZnO precursor bath; maintaining a bath temperature of about 70 degrees C.; and, leaving the substrate in the bath for about an hour. In another aspect, growing the textured zinc oxide film includes forming a textured zinc oxide film with zinc oxide crystals having a pyramidal shape with a height of greater than 200 nanometers.

Additional details of the above-described process are provided in more detail below.

DETAILED DESCRIPTION

Figure 1:
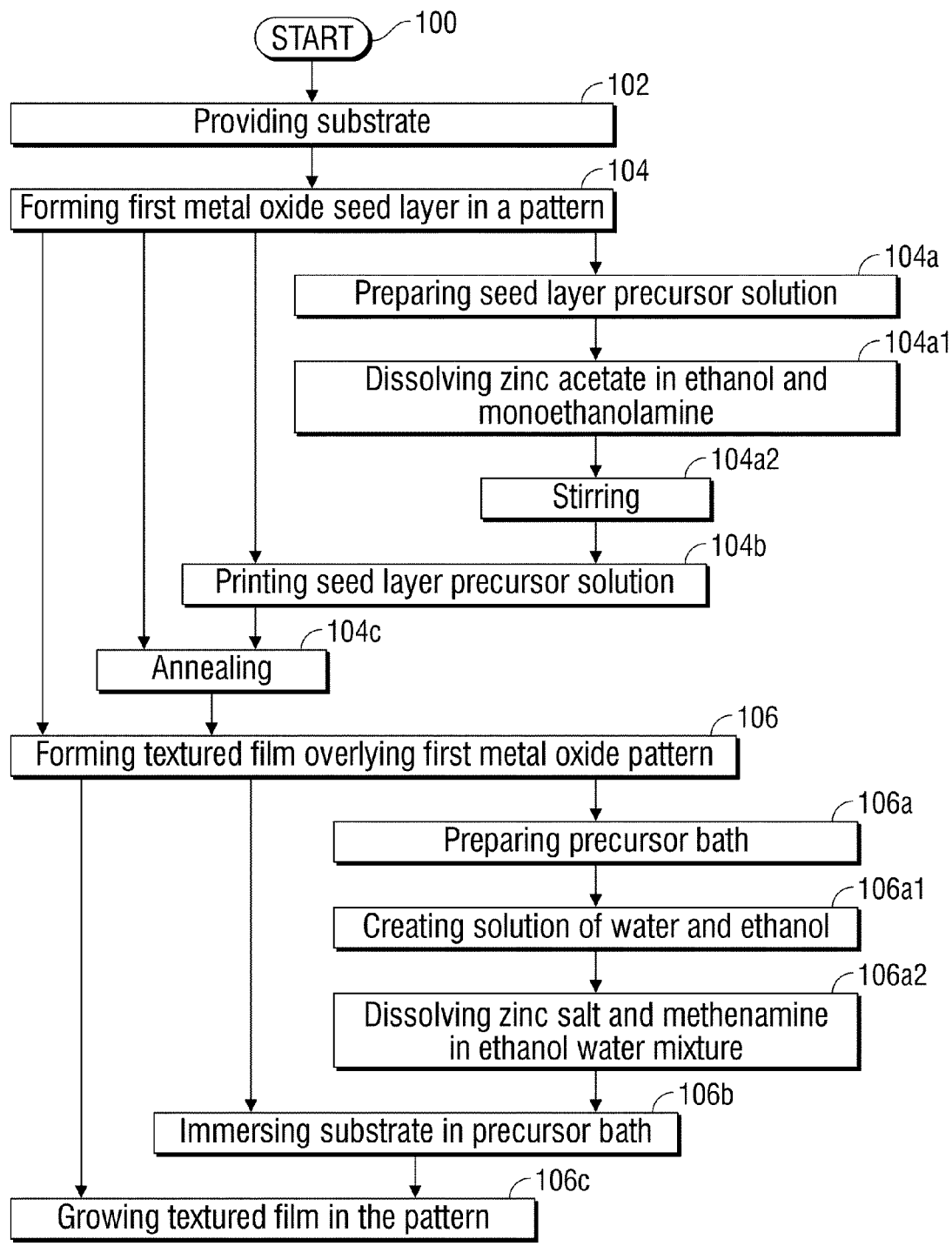
FIG. 1 is a flowchart illustrating a chemical bath deposition (CBD) process for forming a textured film pattern from a metal oxide printed seed layer.

FIG. 1. is a flowchart illustrating a chemical bath deposition (CBD) process for forming a textured film pattern from a metal oxide printed seed layer. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the steps are performed in numerical order. The method starts at Step 100.

Step 102 provides a substrate. For example, the substrate may be soda-lime glass, borosilicate glass, silicon, or a thermal oxide of silicon. Step 104 forms a first metal oxide seed layer in a pattern overlying the substrate. Using a CBD process, Step 106 forms a textured film overlying the first metal oxide seed layer pattern. In one variation, a textured film is formed with crystals having a pyramidal shape with a height of greater than 200 nanometers (nm).

In one aspect, forming the first metal oxide seed layer in Step 104 includes substeps. Step 104a prepares a first metal oxide precursor solution, and Step 104b prints the first metal oxide precursor solution in a pattern on the substrate. For example, the first metal oxide precursor can be printed using a piezoelectric inkjet, thermal inkjet, gravure, offset, microcontact printing, or screen printing process. Step 104c anneals the first metal oxide precursor solution.

In another aspect, forming the textured film in Step 106 includes the following substeps. Step 106a prepares a second metal oxide precursor bath, and Step 106b immerses the substrate in the second metal oxide precursor bath. Step 106c grows a textured second metal oxide film in the pattern from the first metal oxide seed layer. The first and second oxides may be the same metal or different metals. Alternately, the first and second metal oxides can be replaced, respectively, with first and second metal chalcogenides. The first and second metal chalcogenides may be the same or different materials. In one aspect then, Step 106a prepares a metal chalcogenide precursor bath, Step 106b immerses the substrate in the metal precursor bath, and Step 106c grows a textured metal chalcogenide film in the pattern from the first metal oxide seed layer. Suitable metal chalcogenides would include metal sulfides, selenides, tellurides, such as zinc sulfide and cadmium selenide.

For example, forming the first metal oxide seed layer in Step 104 may include forming a ZnO seed layer. Then, preparing a ZnO seed layer precursor solution (Step 104a) includes: Step 104a1—dissolving zinc acetate in a solution of ethanol and monoethanolamine; and, Step 104a2—stirring. Annealing the ZnO precursor in Step 104c includes annealing at a temperature of about 450 degrees C. for about 30 minutes.

In one aspect, forming the textured second oxide film in Step 106c includes forming a textured ZnO film. Then, the process prepares a ZnO precursor bath in Step 106a as follows. Step 106a1 prepares a mixture of water and ethanol. Step 106a2 dissolves a zinc salt and methenamine in the mixture by stirring. The zinc salt may be zinc acetate, zinc nitrate, or zinc chloride for example. The precursor is held at a temperature of about 70 degrees C.

To continue the example, immersing the substrate in a second metal oxide precursor bath (Step 106b) may include maintaining the ZnO precursor bath at a temperature of about 70 degrees C. Then, growing the textured ZnO film in the pattern (Step 106c) includes leaving the substrate in the bath for about an hour.

Figure 2:
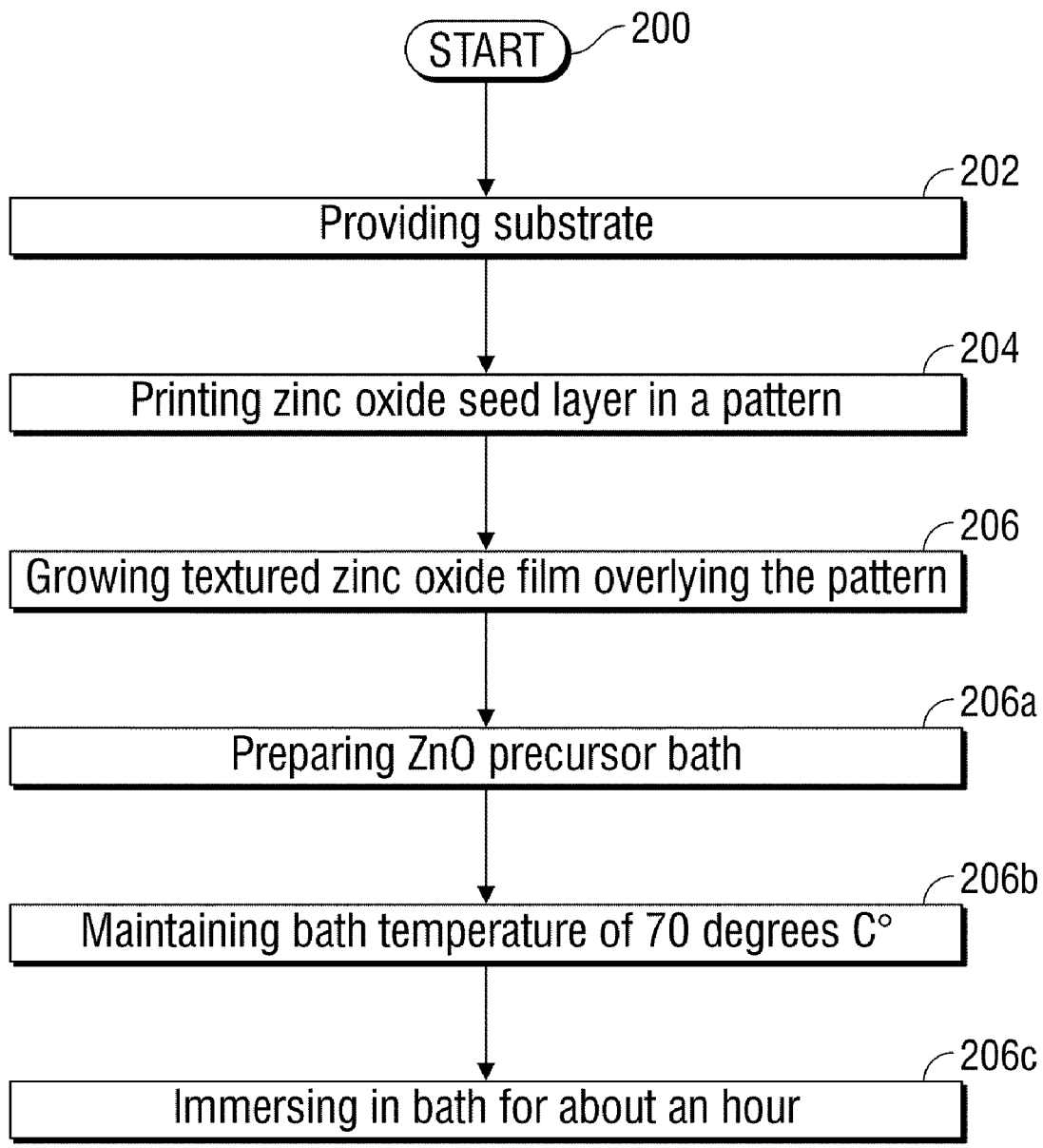
FIG. 2 is a flowchart illustrating a variation of the CBD process of FIG. 1, for forming a textured zinc oxide film pattern from a zinc oxide printed seed layer.

FIG. 2 is a flowchart illustrating a variation of the CBD process of FIG. 1, for forming a textured zinc oxide film pattern from a zinc oxide printed seed layer. The process begins at Step 200. Step 202 provides a substrate. Step 204 prints a zinc oxide seed layer in a pattern overlying the substrate. Using a CBD process, Step 206 grows a textured zinc oxide film overlying the zinc oxide seed layer pattern, where the textured zinc oxide film has a variation in film thickness of greater than 200 nm.

In one aspect, growing the textured zinc oxide film in Step 206 includes substeps. Step 206a prepares a ZnO precursor bath. Step 206b maintains a bath temperature of about 70 degrees C. Step 206c leaves the substrate in the bath for about an hour. Step 206 is capable of forming a textured zinc oxide film with zinc oxide crystals having a pyramidal shape with a height of greater than 200 nm.

The growth of zinc oxide thin films with specific tilted crystal textures, by chemical bath deposition (CBD) methods, has been demonstrated by Wang et al., "Chemical Bath deposition of textured thin film in aqueous/ethanolic solution", Materials Letters, 62(30), pp. 4532-4534, 2008. Typically, a seed layer of ZnO is required to produce film growth and specific crystallographic orientation in the film. In contrast, the above-described processes permit the direct patterning of a ZnO seed layer, with the subsequent CBD growth of textured ZnO only in regions patterned with ZnO seed layer.

As a precursor to the printed ZnO seed layer, a ZnO sol-gel solution may be prepared in the following manner. Zinc acetate is dissolved in ethanol, to which a volume of monoethanolamine is added. The solution is stirred continuously for 14 hours. At this point the solution can be applied to a substrate by a number of printing methods.

A printing method is used to apply the seed layer solution in a pre-determined pattern onto a substrate. The printing method may be chosen from a number of known printing processes including, but not limited to, piezoelectric inkjet, thermal inkjet, gravure, offset, microcontact printing, and screen printing. The printing method is chosen according to device geometry, feature size, resolution, and ink formulation considerations. For example, large area printing can be accomplished by a gravure or screen printing process, whereas small area features can be patterned by inkjet or microcontact printing.

The substrate may be composed of, but not limited to, soda-lime glass, borosilicate glass, silicon, and thermal oxide of silicon. In the case of soda-lime glass, the substrate is rinsed in acetone, isopropanol, and subsequently exposed to acid piranha solution at 140° C. for 5 minutes. The substrate is rinsed in water and blown dry with nitrogen.

A surface treatment such as a silicon coupling agent or a plasma treatment may be used to modify the surface of the substrate prior to printing of the seed layer solution. The substrate surface energetics can be modified to suit the properties of the ZnO seed solution and the printing process.

Figure 3A:
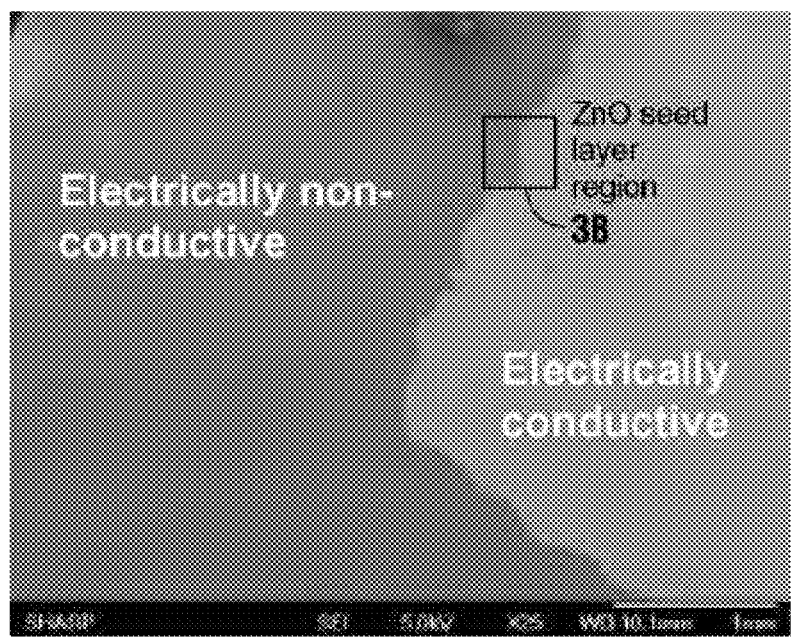
FIGS. 3A and 3B depict a rectangular pattern of ZnO seed layer, where subsequent patterned ZnO growth occurs.
Figure 3B:
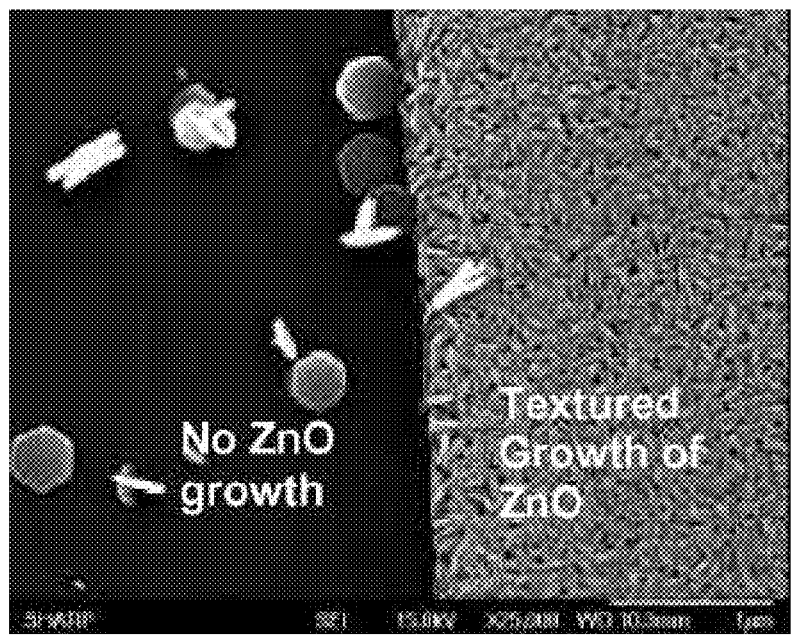

FIGS. 3A and 3B depict a rectangular pattern of ZnO seed layer, where subsequent patterned ZnO growth occurred. A patterned ZnO sol-gel seed layer is applied to the substrate by printing. In this example, a piezoelectric inkjet printer dispenses 0.5 cm×0.5 cm regions of seed layer material on a 2.5 cm×2.5 cm soda-lime glass substrate. The patterned ZnO sol-gel seed layer is annealed at 450° C. for 30 minutes to drive off all remaining ethanol and monoethanolamine. The resulting film is ZnO.

The growth of the textured zinc oxide layer is accomplished by immersing the substrates with the patterned seed layer into a chemical bath prepared in the following manner. Water and ethanol are mixed in a volume ratio of 1/1. Zinc acetate and methenamine are added to the water/ethanol mixture. This solution is heated to 70° C. The growth is allowed to occur for 1 hour at 70° C. The substrates are then removed from solution and rinsed with DI water.

As shown, the textured ZnO growth occurs only in the regions of the substrate patterned by ZnO seed layer. No textured ZnO growth is observed on the bare glass portion of the substrate. Some deposition of homogeneously nucleated hexagonal ZnO crystals from solution is observed in the bare glass regions of the substrate as well as on the patterned ZnO seed layer regions. This deposition can be reduced by controlling the precipitation rate of ZnO material from solution. Thus, the direct patterning of textured ZnO by selectively printing a seed layer has been demonstrated.

Processes have been provided herein for a chemical bath deposition process that forms a textured film pattern from a metal oxide printed seed layer. Examples of particular solvents, metals, and process steps have been given to illustrate the invention. However, the invention is not limited to merely these examples. Other variations and embodiments of the invention will occur to those skilled in the art.

We claim:
1. A chemical bath deposition (CBD) process for forming a textured film from a metal oxide printed seed layer, the process comprising:
  providing a substrate;
  forming a first metal oxide seed layer in a pattern overlying the substrate as follows
    preparing a first metal oxide precursor solution;

printing the first metal oxide precursor solution in a pattern on the substrate;
annealing the first metal oxide precursor solution; and,
using a CBD process, forming a textured film overlying the first metal oxide seed layer pattern.

2. The process of claim 1 wherein printing the first metal oxide precursor includes using a printing process selected from a group consisting of piezoelectric inkjet, thermal inkjet, gravure, offset, microcontact printing, and screen printing.

3. The process of claim 1 wherein forming the textured film includes:
preparing a second metal oxide precursor bath;
immersing the substrate in the second metal oxide precursor bath; and,
growing a textured second metal oxide film in the pattern from the first metal oxide seed layer.

4. The process of claim 3 wherein the metal in the first and second oxides is the same metal.

5. The process of claim 3 wherein the metals in the first and second oxides are different metals.

6. The process of claim 3 wherein growing the textured second oxide film includes growing a textured ZnO film.

7. The process of claim 6 wherein preparing the second metal oxide precursor bath includes preparing a ZnO precursor bath as follows:
creating a mixture of water and ethanol; and,
dissolving a zinc salt and methenamine in the mixture.

8. The princess of claim 7 wherein immersing the substrate in the second metal oxide precursor bath includes maintaining the ZnO precursor bath at a temperature of about degrees C.; and,
wherein growing the textured ZnO film in the pattern includes leaving the substrate in the bath for about an hour.

9. The process of claim 7 wherein dissolving the zinc salt and methenamine in the mixture includes dissolving a zinc salt selected from a group consisting of zinc acetate, zinc nitrate, and zinc chloride.

10. The process of claim 1 wherein forming the first metal oxide seed layer includes forming a ZnO seed layer.

11. The process of claim 10 wherein preparing the first metal oxide precursor solution includes preparing a ZnO seed layer precursor solution as follows:
dissolving zinc acetate in a solution of ethanol and monoethanolamine; and,
stirring.

12. The process of claim 11 wherein annealing the first metal oxide precursor solution includes annealing the ZnO precursor solution at a temperature of about 450 degrees C. for about 30 minutes.

13. The process of claim 1 wherein providing the substrate includes providing the substrate selected from a group consisting of soda-lime glass, borosilicate glass, silicon, and thermal oxide of silicon.

14. The process of claim 1 wherein forming the textured film overlying the first metal oxide seed layer pattern includes forming a textured film with crystals having a pyramidal shape with a height of greater than 200 nanometers.

15. The process of claim 1 wherein forming the textured film includes:
preparing a metal chalcogenide precursor bath;
immersing the substrate in the metal chalcogenide precursor bath; and,
growing a textured metal chalcogenide film in the pattern from the first metal oxide seed layer.

16. A chemical bath deposition (CBD) process for forming a textured zinc oxide film pattern from a zinc oxide printed seed layer, the process comprising:
providing a substrate;
printing a zinc oxide seed layer in a pattern overlying the substrate; and,
using a CBD process, growing a textured zinc oxide film overlying the zinc oxide seed layer pattern, where the textured zinc oxide film has a variation in film thickness of greater than 200 nanometers.

17. The process of claim 16 wherein growing the textured zinc oxide film includes:
preparing a ZnO precursor bath;
maintaining a bath temperature of about 70 degrees C.; and,
leaving the substrate in the bath for about an hour.

18. The process of claim 16 wherein growing the textured zinc oxide film includes forming a textured zinc oxide film with zinc oxide crystals having a pyramidal shape with a height of greater than 200 nanometers.

19. A chemical bath deposition (CBD) process for forming a textured film pattern from a metal oxide printed seed layer, the process comprising:
providing a substrate;
forming a first metal oxide seed layer in a pattern overlying the substrate; and,
using a CBD process, forming a textured film overlying the first metal oxide seed layer pattern as follows:
preparing a metal chalcogenide precursor bath;
immersing the substrate in the metal chalcogenide precursor bath; and,
growing a textured metal chalcogenide film in the pattern from the first metal oxide seed layer.

20. A chemical bath deposition (CBD) process for forming a textured film pattern from a metal oxide printed seed layer, the process comprising:
providing a substrate;
forming a first metal oxide seed layer in a pattern overlying the substrate; and,
using a CBD process, forming a textured film with crystals having a pyramidal shape and a height of greater than 200 nanometers, overlying the first metal oxide seed layer pattern.

* * * * *